(12) United States Patent
Miura

(10) Patent No.: US 10,151,034 B2
(45) Date of Patent: Dec. 11, 2018

(54) SUBSTRATE PROCESSING METHOD INCLUDING SUPPLYING A FLUORINE-CONTAINING GAS ON A SURFACE OF A SUBSTRATE

(71) Applicant: Tokyo Electron Limited, Tokyo (JP)

(72) Inventor: Shigehiro Miura, Iwate (JP)

(73) Assignee: Tokyo Electron Limited, Tokyo (JP)

(*) Notice: Subject to any disclaimer, the term of this patent is extended or adjusted under 35 U.S.C. 154(b) by 69 days.

(21) Appl. No.: 15/051,836

(22) Filed: Feb. 24, 2016

(65) Prior Publication Data

US 2016/0258065 A1 Sep. 8, 2016

(30) Foreign Application Priority Data

Mar. 3, 2015 (JP) .................................. 2015-041499

(51) Int. Cl.
*C23C 16/52* (2006.01)
*C23C 16/455* (2006.01)
(Continued)

(52) U.S. Cl.
CPC ............ *C23C 16/52* (2013.01); *C23C 16/045* (2013.01); *C23C 16/4584* (2013.01);
(Continued)

(58) Field of Classification Search
CPC .............. C23C 16/52; C23C 16/45557; C23C 16/4584; C23C 16/50; H01L 21/67069;
(Continued)

(56) References Cited

U.S. PATENT DOCUMENTS 4,462,863 A * 7/1984 Nishimatsu ....... H01J 37/32192
204/192.32
6,451,217 B1 * 9/2002 Yanagisawa ...... H01J 37/32192
216/67
(Continued)

FOREIGN PATENT DOCUMENTS

CN 102732854 10/2012
JP 2003-142484 5/2003
(Continued)

*Primary Examiner* — Matthew Reames
*Assistant Examiner* — Scott Bauman
(74) *Attorney, Agent, or Firm* — IPUSA, PLLC

(57) ABSTRACT

A substrate processing apparatus includes a rotary table arranged in a vacuum chamber, a first reaction gas supply unit that supplies a first reaction gas to a surface of the rotary table, a second reaction gas supply unit that is arranged apart from the first reaction gas supply unit and supplies a second reaction gas, which reacts with the first reaction gas, to the surface of the rotary table, and an activated gas supply unit that is arranged apart from the first and second reaction gas supply units. The activated gas supply unit includes a discharge unit that supplies an activated fluorine-containing gas to the surface of the rotary table, a pipe that is arranged upstream of the discharge unit and supplies the fluorine-containing gas to the discharge unit, and at least one hydrogen-containing gas supply unit arranged at the pipe for supplying a hydrogen-containing gas into the pipe.

8 Claims, 8 Drawing Sheets

(51) Int. Cl.
  *C23C 16/04* (2006.01)
  *C23C 16/50* (2006.01)
  *C23C 16/458* (2006.01)
  *H01L 21/311* (2006.01)
  *H01L 21/02* (2006.01)
  *H01L 21/687* (2006.01)
  *H01L 21/768* (2006.01)
  *H01L 21/67* (2006.01)

(52) U.S. Cl.
  CPC .. *C23C 16/45527* (2013.01); *C23C 16/45551* (2013.01); *C23C 16/45557* (2013.01); *C23C 16/50* (2013.01); *H01L 21/0228* (2013.01); *H01L 21/02164* (2013.01); *H01L 21/31116* (2013.01); *H01L 21/67069* (2013.01); *H01L 21/68764* (2013.01); *H01L 21/68771* (2013.01); *H01L 21/76802* (2013.01)

(58) Field of Classification Search
  CPC ......... H01L 21/68764; H01L 21/68771; H01L 21/6802
  USPC .......................................................... 438/703
  See application file for complete search history.

(56) References Cited

U.S. PATENT DOCUMENTS

| | | | |
|---|---|---|---|
| 7,112,531 B2* | 9/2006 | Srinivasan | C23C 16/401 257/E21.252 |
| 2007/0218702 A1* | 9/2007 | Shimizu | C23C 16/06 438/758 |
| 2008/0026162 A1* | 1/2008 | Dickey | C23C 16/452 427/569 |
| 2012/0267341 A1 | 10/2012 | Kato et al. | |
| 2012/0295427 A1* | 11/2012 | Bauer | H01L 21/02532 438/494 |
| 2014/0134827 A1 | 5/2014 | Swaminathan et al. | |
| 2015/0050815 A1* | 2/2015 | Yanagisawa | C23C 16/455 438/778 |
| 2017/0125258 A1* | 5/2017 | Sato | H01L 21/30655 |

FOREIGN PATENT DOCUMENTS

| | | |
|---|---|---|
| JP | 2010-056470 | 3/2010 |
| JP | 2012-209394 | 10/2012 |
| JP | 2014-112668 | 6/2014 |
| TW | 201430951 | 8/2014 |

* cited by examiner

SUBSTRATE PROCESSING METHOD INCLUDING SUPPLYING A FLUORINE-CONTAINING GAS ON A SURFACE OF A SUBSTRATE

BACKGROUND OF THE INVENTION

1. Field of the Invention

The present invention generally relates to a substrate processing apparatus and a substrate processing method.

2. Description of the Related Art

With the miniaturization of circuit patterns of semiconductor devices, there is a growing demand for techniques for reducing the thickness and improving the uniformity of various films constituting semiconductor devices. In view of such a demand, the so-called molecular layer deposition (MLD) method or the atom layer deposition (ALD) method is known as a film forming method that involves supplying a first reaction gas to a substrate to cause adsorption of the first reaction gas to the surface of the substrate, then supplying a second reaction gas to the substrate to cause a reaction between the first reaction gas that is adsorbed on the surface of the substrate and the second reaction gas, and depositing a film that is made of the reaction product on the substrate (e.g., see Japanese Laid-Open Patent Publication No. 2010-56470).

According to the above film forming method, the reaction gas may be adsorbed to the surface of the substrate in a (quasi) self-saturating manner such that high film thickness controllability, desirable uniformity, and desirable embedding characteristics may be achieved.

However, in view of the miniaturization of circuit patterns, for example, as the aspect ratio of a space in a line/space pattern increases in a trench element separation structure, it becomes increasingly difficult to embed a film in a trench or a space even when the MLD method or the ALD method is used.

For example, when embedding a space having a width of about 30 nm in a silicon oxide film, it may be difficult to introduce a reaction gas to the bottom of such a narrow space, and as a result, the film thickness at the upper end portions of line side walls defining the space may increase. Thus, in some cases, a void may be created in the silicon oxide film having a space embedded by a film. When such a silicon oxide film is etched in a subsequent etching process, for example, an opening communicating with the void may be formed at the upper surface of the silicon oxide film. In such case, an etching gas (or etching solution) may enter the void through the opening to cause contamination, or a metal may enter the void during a metallization process performed thereafter to create defects, for example.

The occurrence of such a problem is not limited to the case of using the MLD method or the ALD method, but may also occur in the case of using a chemical vapor deposition (CVD) method. For example, when embedding a film made of conductive material in a contact hole that is formed in a semiconductor substrate to create a conductive contact hole (a so-called plug), a void may be formed in the plug. In this respect, a method of forming a conductive contact hole while preventing the formation of such a void in the conductive contact hole is known. For example, when embedding a conductive material in a contact hole to form a conductive contact hole, an etch back process may be repeatedly performed to remove an overhanging portion of the conductive material that is formed around the upper end of the contact hole (e.g., see Japanese Laid-Open Patent Publication No. 2003-142484).

However, according to the method described in Japanese Laid-Open Patent Publication No. 2003-142484, the process of forming the conductive material film and the etch back process have to be performed in different apparatuses. Thus, time is required in transporting the substrate back and forth between the apparatuses and stabilizing process conditions in each apparatus such that throughput cannot be increased.

Also, a film forming apparatus and a film forming method are known that may solve the above problems of the method described in Japanese Laid-Open Patent Publication No. 2003-142484. The film forming apparatus and the film forming method enable embedding at a high throughput while reducing the occurrence of voids in a concave pattern formed on the surface of a substrate. The film forming apparatus includes a rotary table on which a substrate is mounted, first and second gas supply units that are capable of supplying first and second reaction gases for film formation to a substrate mounting surface of the rotary table, and an activated gas supply unit that activates and supplies a modification gas for modifying a reaction product generated by a reaction between the first and second reaction gases and an etching gas used for etching. The film formation method involves using such a film forming apparatus to successively repeat the processes of film formation, modification, and etching within the same processing chamber through rotation of the rotary table (e.g., see Japanese Laid-Open Patent Publication No. 2012-209394).

However, in the film forming method described in Japanese Laid-Open Patent Publication No. 2012-209394, the etching amount distribution in the substrate surface cannot be adequately controlled, and it is difficult to achieve etching uniformity in the substrate surface.

SUMMARY OF THE INVENTION

One aspect of the present invention provides a substrate processing apparatus that is capable of controlling an etching amount distribution in within a substrate surface.

According to one embodiment of the present invention, a substrate processing apparatus is provided that includes a vacuum chamber; a rotary table that is rotatably arranged in the vacuum chamber to hold a substrate; a first reaction gas supply unit that supplies a first reaction gas to a surface of the rotary table; a second reaction gas supply unit that is arranged apart from the first reaction gas supply unit in a circumferential direction of the rotary table and supplies a second reaction gas, which reacts with the first reaction gas, to the surface of the rotary table; and an activated gas supply unit arranged apart from the first reaction gas supply unit and the second reaction gas supply unit in the circumferential direction of the rotary table. The activated gas supply unit includes a discharge unit that supplies a fluorine-containing gas, which has been activated, to the surface of the rotary table; a pipe that is arranged upstream of the discharge unit and supplies the fluorine-containing gas to the discharge unit; and at least one hydrogen-containing gas supply unit that is arranged at the pipe and supplies a hydrogen-containing gas into the pipe.

DESCRIPTION OF THE PREFERRED EMBODIMENTS

Figure 1:
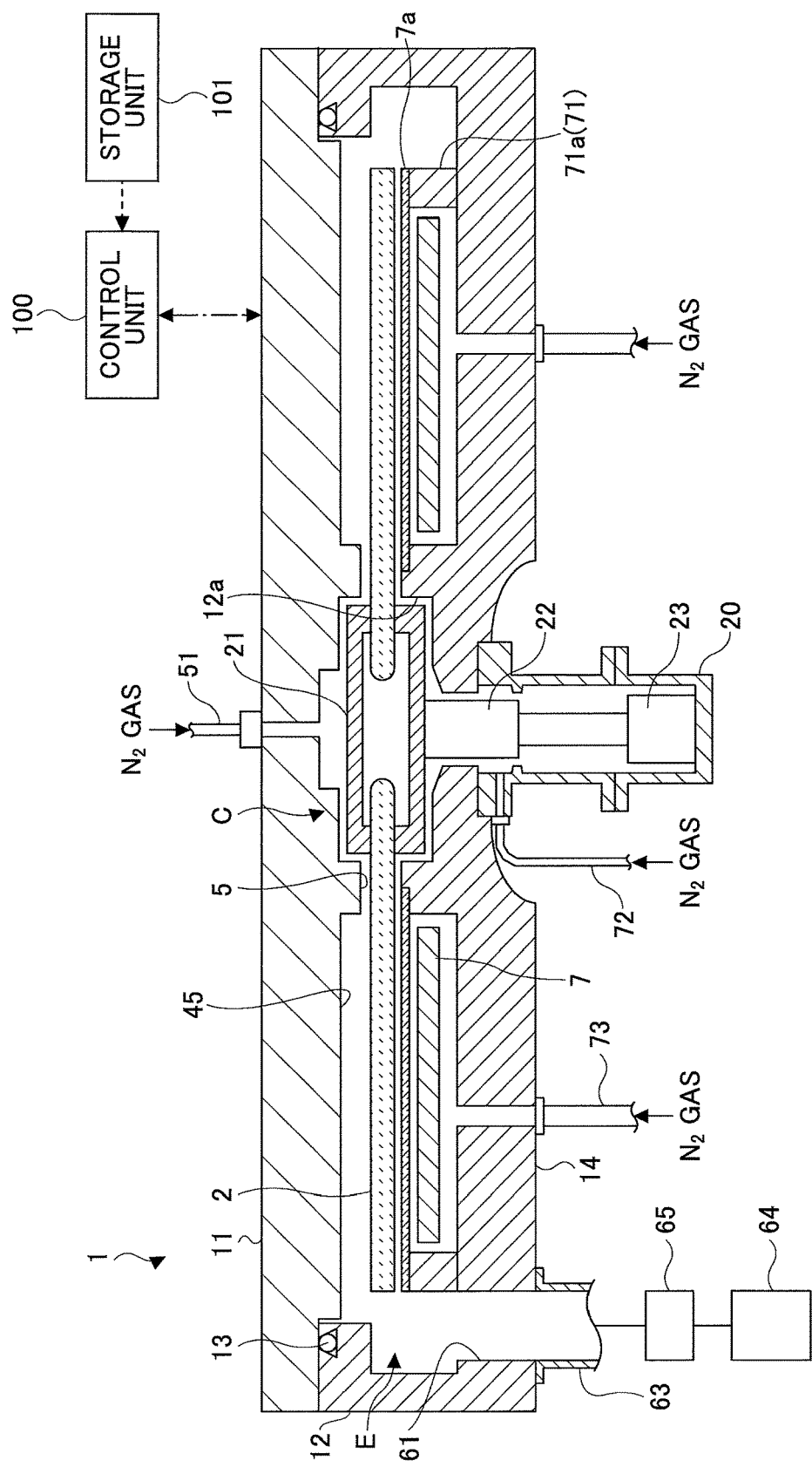
FIG. 1 is a schematic cross-sectional view of a substrate processing apparatus according to an embodiment of the present invention.

In the following, embodiments of the present invention will be described with reference to the accompanying drawings. Note that in the following descriptions and the accompanying drawings, elements having substantially the same functional features are given the same reference numerals and overlapping descriptions thereof may be omitted.

(Substrate Processing Apparatus Configuration)

Figure 2:
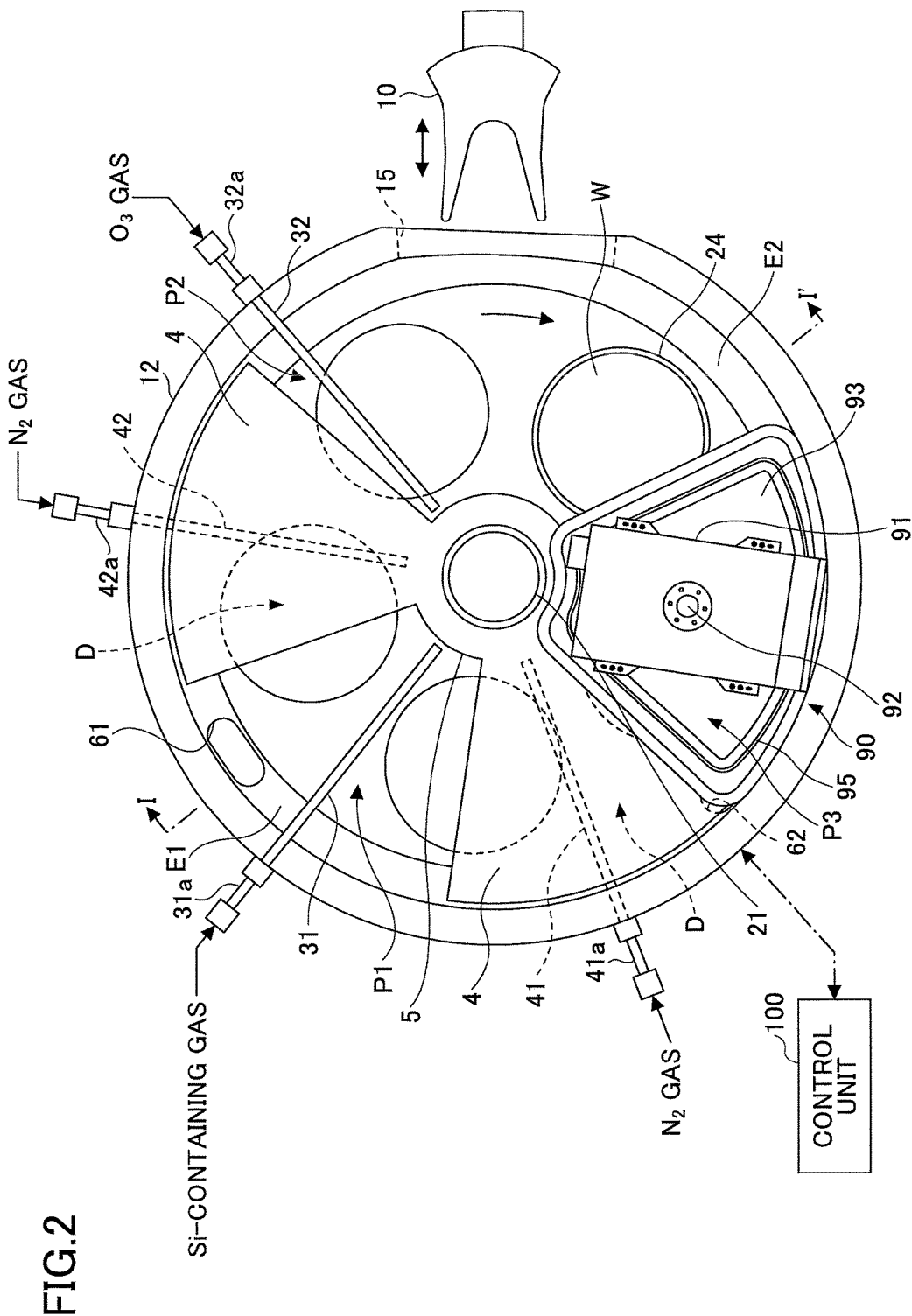
FIG. 2 is a schematic plan view of the substrate processing apparatus.
Figure 3:
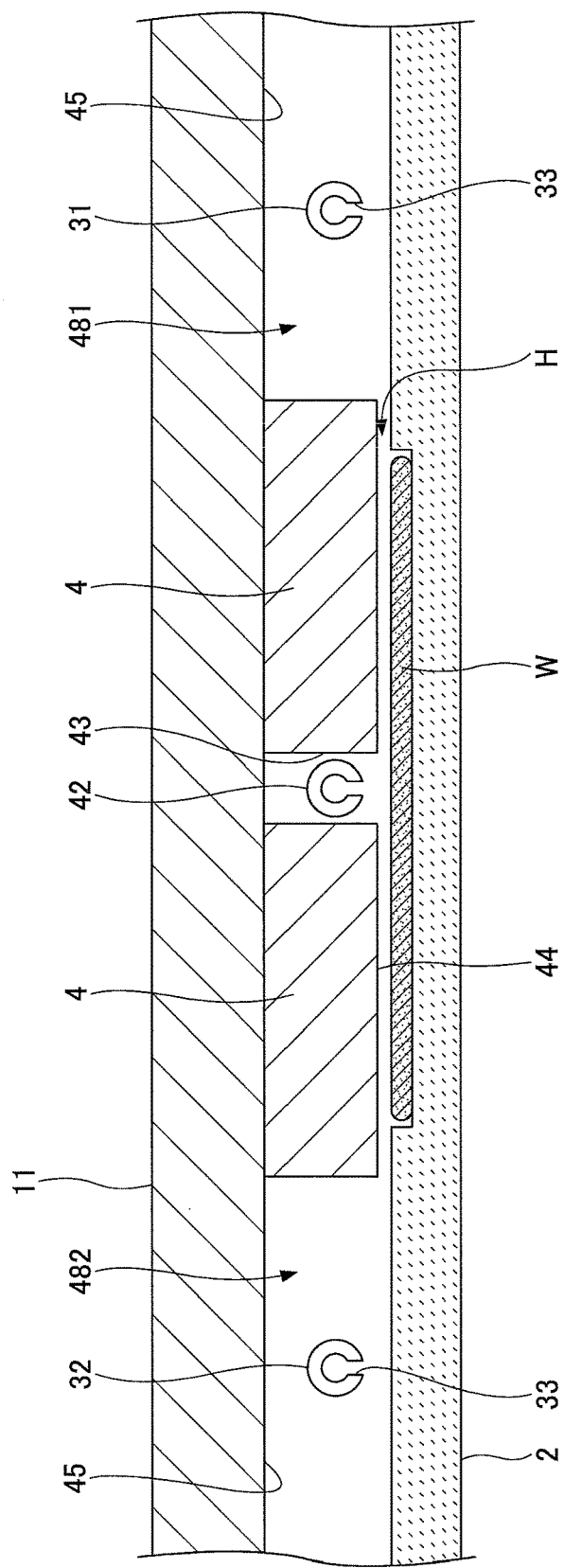
FIG. 3 is a partial cross-sectional view illustrating separation regions in the substrate processing apparatus.
Figure 4:
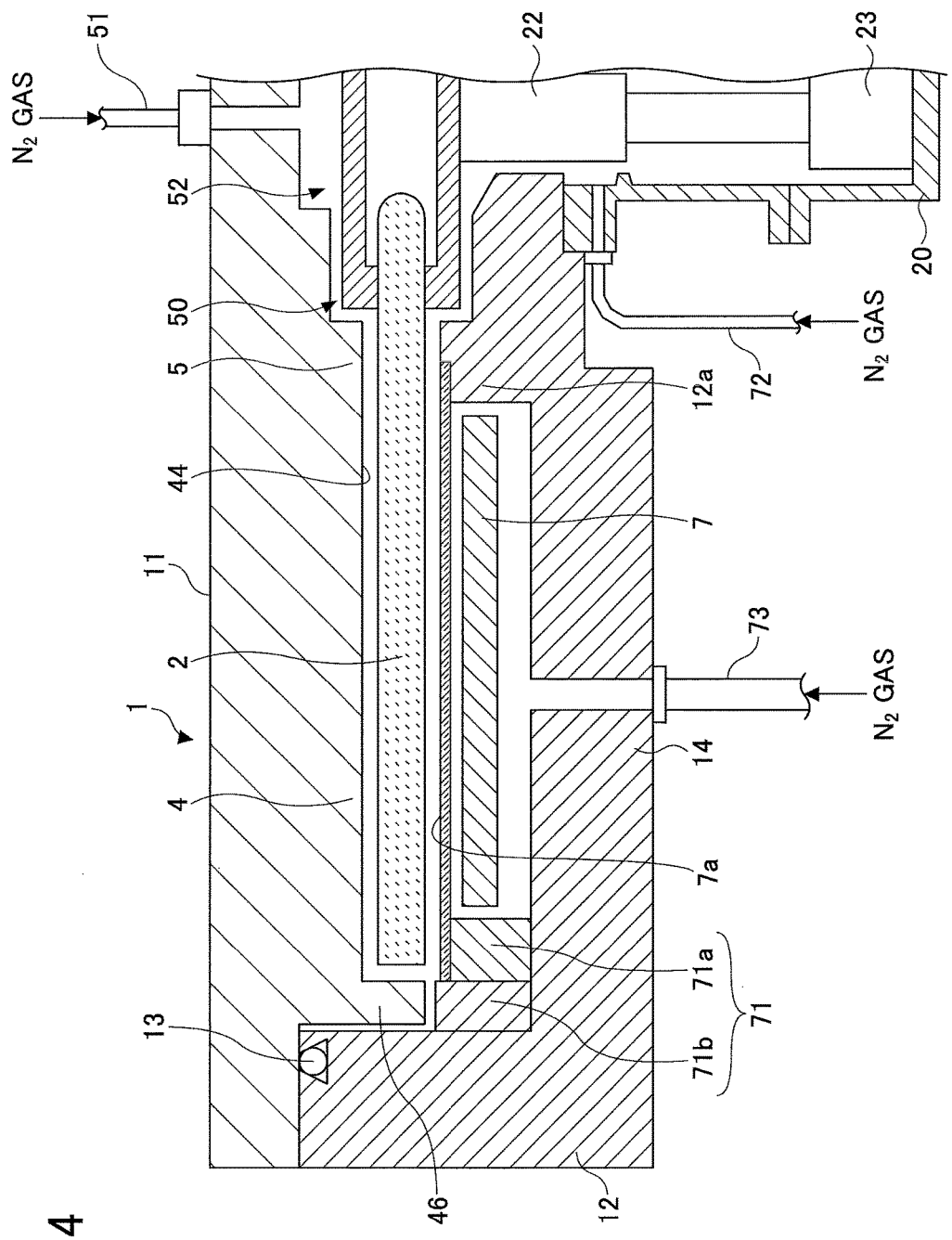
FIG. 4 is another partial cross-sectional view of the substrate processing apparatus.

In the following, the configuration of a substrate processing apparatus according to an embodiment of the present invention is described. FIG. 1 is a schematic cross-sectional view of the substrate processing apparatus according to the present embodiment. FIG. 2 is a schematic plan view of the substrate processing apparatus according to the present embodiment. FIG. 3 is a partial cross-sectional view illustrating separation regions of the substrate processing apparatus according to the present embodiment. FIG. 4 is another partial cross-sectional view of the substrate processing apparatus according to the present embodiment.

As illustrated in FIGS. 1 and 2, the substrate processing apparatus according to the present embodiment includes a vacuum chamber 1 having a substantially circular planar shape, and a rotary table 2 that is arranged within the vacuum chamber 1 such that the center of the vacuum chamber 1 corresponds to the rotational center of the rotary table 2.

The vacuum chamber 1 includes a chamber body 12 having a cylindrical shape with a bottom, and a ceiling plate 11 that is detachably arranged on an upper surface of the chamber body 12 and is sealed airtight to the upper surface via a sealing member 13 such as an O-ring.

The rotary table 2 has a center portion that is fixed to a cylindrical core portion 21. The core portion 21 is fixed to an upper end of a rotary shaft 22 extending in the vertical direction. The rotary shaft 22 penetrates through a bottom portion 14 of the vacuum chamber 1 and has a lower end that is attached to a drive unit 23 for rotating the rotary shaft 22 around a vertical axis. The rotary shaft 22 and the drive unit 23 are accommodated in a cylindrical case 20 having an opening formed at its upper face. The case 20 has a flange portion formed at its upper face that is attached airtight to a bottom surface of the bottom portion 14 of the vacuum chamber 1, and in this way, an internal atmosphere within the case 20 may be maintained airtight from an external atmosphere of the case 20.

As illustrated in FIG. 2, a plurality (e.g., 5 in the illustrated example) of circular concave portions 24 that are capable of accommodating a plurality of semiconductor wafers corresponding to substrates (hereinafter referred to as "wafer W") are arranged along a rotational direction (circumferential direction) on the surface of the rotary table 2. Note that in FIG. 2, for convenience, the wafer W is illustrated in only one of the concave portions 24. The concave portion 24 has an inner diameter that is slightly larger (e.g., larger by 4 mm) than the diameter of the wafer W (e.g., 300 mm), and a depth that is approximately equal to the thickness of the wafer W. Thus, when the wafer W is placed in the concave portion 24, the surface of the wafer W and the surface of the rotary table 2 (i.e., surface of the region where the wafer W is not placed) may be substantially flush. Also, a number (e.g., 3) of through holes (not shown) are formed at a bottom face of the concave portion 24 such that lift pins (not shown) for supporting the rear face of the wafer W and lifting the wafer W may be arranged to penetrate through the through holes.

Also, as illustrated in FIG. 2, reaction gas nozzles 31 and 32, separation gas nozzles 41 and 42, and an activated gas supply unit 90 are arranged above the rotary table 2. In the illustrated example, the activated gas supply unit 90, the separation gas nozzle 41, the reaction gas nozzle 31, the separation gas nozzle 42, and the reaction gas nozzle 32 are spaced apart along the circumferential direction of the vacuum chamber 1 in the recited order as viewed clockwise (rotational direction of the rotary table 2) from a transfer port 15 (described below). Note that the reaction gas nozzle 31 is an example of a first reaction gas supply unit, and the reaction gas nozzle 32 is an example of a second reaction gas supply unit.

The reaction gas nozzles 31 and 32 respectively include gas introduction ports 31a and 32a corresponding to base portions that are fixed to an outer peripheral wall of the chamber body 12. The reaction gas nozzles 31 and 32 are introduced into the vacuum chamber 1 from the outer peripheral wall of the vacuum chamber 1. Also, the reaction gas nozzles 31 and 32 are arranged to extend parallel with respect to the rotating table 2 along the radial directions of the chamber body 12.

The separation gas nozzles 41 and 42 respectively include gas introduction ports 41a and 42a corresponding to base portions that are fixed to the outer peripheral wall of the chamber body 12. The separation gas nozzles 41 and 42 are introduced into the vacuum chamber 1 from the outer peripheral wall of the vacuum chamber 1. The separation gas nozzles 41 and 42 are arranged to extend parallel with respect to the rotary table 2 along the radial directions of the chamber body 12.

Note that the activated gas supply unit 90 is described below.

The reaction gas nozzle 31 may be made of quartz, for example, and is connected to a supply source of a Si (silicon)-containing gas that is used as a first reaction gas via a pipe and a flow regulator (not shown), for example. The reaction gas nozzle 32 may be made of quartz, for example, and is connected to a supply source of an oxidizing gas that is used as a second reaction gas via a pipe and a flow regulator (not shown), for example. The separation gas nozzles 41 and 42 are each connected to supply sources of separation gases via a pipe and a flow rate regulating valve (not shown), for example.

Note that organic amino silane gas may be used as the Si-containing gas, and $O_3$ (ozone) gas or $O_2$ (oxygen) gas may be used as the oxidizing gas, for example. Also, $N_2$ (nitrogen) gas and Ar (argon) gas may be used as the separation gases, for example.

The reaction gas nozzles 31 and 32 have a plurality of gas discharge holes 33 that open toward the rotary table 2 (see FIG. 3). The gas discharge holes 33 may be arranged at intervals of 10 mm, for example, along the length direction of the reaction gas nozzles 31 and 32, for example. A lower region of the reaction gas nozzle 31 corresponds to a first process region P1 for causing adsorption of the Si-containing gas to the wafer W. A lower region of the reaction gas nozzle 32 corresponds to a second process region P2 for oxidizing the Si-containing gas that has been adsorbed to the wafer W at the first process region P1.

Referring to FIG. 2, convex portions 4 protruding toward the rotary table 2 from bottom face regions of the ceiling plate 11 near the separation gas nozzles 41 and 42 are provided in the vacuum chamber 1. The convex portions 4 and the separation gas nozzles 41 and 42 form separation regions D. The convex portion 4 is fan-shaped in planar view and has a top portion that is cut into a circular arc shape. In the present embodiment, the inner arc of the convex portion 4 is connected to a protruding portion 5 (described below) and the outer arc of the convex portion 4 is arranged along an inner peripheral surface of the chamber body 12 of the vacuum chamber 1.

FIG. 3 is a partial cross-sectional view of the vacuum chamber 1 along a concentric circle of the rotary table 2 from the reaction gas nozzle 31 to the reaction gas nozzle 32. As illustrated in FIG. 3, the vacuum chamber 1 includes a first ceiling surface 44 corresponding to the bottom face of the convex portion 4 that is low and flat, and a second ceiling surface 45 that is higher than the first ceiling surface 44 and is arranged at both sides of the first ceiling surface 44 in the circumferential direction.

The first ceiling surface 44 is fan-shaped in planar view and has a top portion that is cut into a circular arc shape. Also, as illustrated in FIG. 3, a groove portion 43 extending in a radial direction is formed at the circumferential direction center of the convex portion 4, and the separation gas nozzle 42 is accommodated within this groove portion 43. Note that another groove portion 43 is similarly formed in the other convex portion 4, and the separation gas nozzle 41 is accommodated within this groove portion 43. Also, the reaction gas nozzles 31 and 32 are arranged in spaces below the higher second ceiling surface 45. The reaction gas nozzles 31 and 32 are spaced apart from the second ceiling surface 45 to be arranged close to the wafer W. Note that for convenience of explanation, the space below the higher second ceiling surface 45 where the reaction gas nozzle 31 is arranged is represented as "space 481", the space below the higher second ceiling surface 45 where the reaction gas nozzle 32 is arranged is represented as "space 482" (see FIG. 3).

The first ceiling surface 44 forms a separation space H corresponding to a narrow space between the first ceiling surface 44 and the surface of the rotary table 2. The separation space H can separate the Si-containing gas supplied from the first region P1 and the oxidizing gas supplied from the second region P2 from each other. Specifically, when $N_2$ gas is discharged from the separation gas nozzle 42, the $N_2$ gas discharged from the separation gas nozzle 42 flows toward the space 481 and the space 482 through the separation space H. At this time, because the $N_2$ gas flows through the narrow separation space H that has a smaller volume compared to the spaces 481 and 482, the pressure in the separation space H can be made higher than the pressure in the spaces 481 and 482. That is, a pressure barrier may be created between the spaces 481 and 482. Also, the $N_2$ gas flowing from the separation space H into the spaces 481 and 482 act as counter-flows against the flow of the Si-containing gas from the first area P1 and the flow of the oxidizing gas from the second region P2. Thus, the Si-containing gas and the oxidizing gas may be substantially prevented from flowing into the separation space H. In this way, the Si-containing gas and the oxidizing gas are prevented from mixing and reacting with each other in the vacuum chamber 1.

Referring to FIG. 2, the protruding portion 5 is arranged around the outer periphery of the core portion 21 that fixes the rotary table 2, and the protruding portion 5 is arranged on the bottom surface of the ceiling plate 11. In the present embodiment, the protruding portion 5 is connected to a rotational center side portion of the convex portion 4, and a bottom surface of the protruding portion 5 is arranged to be flush with the first ceiling surface 44.

Note that for convenience of explanation, FIG. 2 illustrates a cross-section of the chamber body 12 cut along a position that is higher than the second ceiling surface 45 and lower than the separation gas nozzles 41 and 42.

FIG. 1 referred to above is a cross-sectional view of the substrate processing apparatus along line I-I' of FIG. 2 illustrating a region where the second ceiling surface 45 is arranged. On the other hand, FIG. 4 is a partial cross-sectional view of the substrate processing apparatus illustrating a region where the first ceiling surface 44 is arranged.

As illustrated in FIG. 4, a bent portion 46 that is bent into an L-shape to face an outer edge face of the rotary table 2 is formed at a peripheral portion (portion toward the outer edge of the vacuum chamber 1) of the fan-shaped convex portion 4. The bent portion 46, like the convex portion 4, prevents the two reaction gases from entering the separation space H from both sides of the separation area D and prevents the two reaction gases from mixing with each other. The fan-shaped convex portion 4 is arranged at the ceiling plate 11, and the ceiling plate 11 is arranged to be detachable from the chamber body 12. Thus, a slight gap is formed between an outer peripheral face of the bent portion 46 and the chamber body 12. Note that dimensions of a gap between an inner peripheral face of the bent portion 46 and an outer edge face of the rotary table 2, and the gap between the outer peripheral face of the bent portion 46 and the chamber body 12 may be substantially the same as the height dimension of the first ceiling surface 44 with respect to the surface of the rotary table 2, for example.

In the separation region D, an inner peripheral wall of the chamber body 12 is arranged into a substantially vertical plane that is in close proximity with the outer peripheral face of the bent portion 46 as illustrated in FIG. 4. Note, however, that in regions other than the separation region D, the inner peripheral wall of the chamber body 12 may have a portion recessed outward from a region facing the outer edge face of the rotary table 12 to the bottom portion 14 as illustrated in FIG. 1, for example. In the following, for convenience of explanation, such a recessed portion having a rectangular cross section is referred to as "exhaust region E". More specifically, the exhaust region E that communicates with the first process region P1 is referred to as "first exhaust region E1", and the exhaust region E that communicates with the second process region P2 is referred to as "second exhaust region E2" as illustrated in FIG. 2. Further, a first exhaust port 61 and a second exhaust port 62 are respectively formed at the bottom of the first exhaust region E1 and the second exhaust region E2. As illustrated in FIG. 1, the first exhaust port 61 and the second exhaust port 62 are each connected to a vacuum exhaust unit such as a vacuum pump 64 via an exhaust pipe 63. Also, a pressure regulating unit 65 is arranged at the exhaust pipe 63.

As illustrated in FIGS. 1 and 4, a heater unit 7 as a heating unit may be arranged in a space between the rotary table 2 and the bottom portion 14 of the vacuum chamber 1, and a wafer W arranged on the rotary table 2 may be heated to a predetermined temperature according to a process recipe via the rotary table 2. Also, a ring-shaped cover member 71 for preventing gas from entering a lower region of the rotary table 2 is arranged at a lower side of a peripheral edge portion of the rotary table 2. The cover member 71 acts as a partition member for separating the atmosphere of a region extending from the space above the rotary table 2 to the exhaust regions E1 and E2 and the atmosphere of a space where the heater unit 7 is arranged.

The cover member 71 includes an inner member 71a that is arranged to face an outer edge portion of the rotary table 2 and a portion extending further outward from this outer edge portion from the lower side, and an outer member 71b that is arranged between the inner member 71a and an inner wall face of the vacuum chamber 1. In the separation region D, the outer member 71b is arranged near the bent portion 46, at the lower side of the bent portion 46, which is formed at the outer edge portion of the convex portion 4. The inner member 71a is arranged to surround the entire periphery of the heater unit 7 at the lower side of the outer edge portion of the rotary table 2 (and the portion extending slightly outward from the outer edge portion).

A protrusion 12a is formed at a part of the bottom portion 14 toward the rotational center of the space where the heater unit 7 is disposed. The protrusion 12a protrudes upward to approach the core portion 21 at a center portion of the bottom surface of the rotary table 2. A narrow space is formed between the protrusion 12a and the core portion 21. Also, a narrow space is provided between an outer peripheral face of the rotary shaft 22 that penetrates through the bottom portion 14 and the inner peripheral face of a through hole for the rotary shaft 22. Such narrow spaces are arranged to be in communication with the case 20. Further, a purge gas supply pipe 72 for supplying $N_2$ gas as a purge gas is arranged at the case 20.

Also, a plurality of purge gas supply pipes 73 for purging the space accommodating the heater unit 7 are arranged at the bottom portion 14 of the vacuum chamber 1 at intervals of a predetermined angle along the circumferential direction below the heater unit 7 (only one of the purge gas supply pipes 73 is illustrated in FIG. 4). Also, a lid member 7a is arranged between the heater unit 7 and the rotating table 2 in order to prevent gas from entering the region where the heater unit 7 is located. The lid member 7a is arranged to extend in the circumferential direction to cover a region between an inner wall of the outer member 71b (upper face of the inner member 71a) and an upper edge portion of the protrusion 12a. The lid member 7a may be made of quartz, for example.

Also, a separation gas supply pipe 51 is connected to a center portion of the ceiling plate 11 of the vacuum chamber 1. The separation gas supply pipe 51 is configured to supply $N_2$ gas as a separation gas to a space 52 between the ceiling plate 11 and the core portion 21. The separation gas supplied to the space 52 is discharged toward the periphery of the rotary table 2 along a wafer mounting area side surface of the rotary table 2 via a narrow space 50 between the protruding portion 5 and the rotary table 2. The pressure within the space 50 can be maintained at a higher pressure than the pressure within the space 481 and the space 482 by the separation gas. That is, by providing the space 50, the Si-containing gas supplied to the first process region P1 and the oxidizing gas supplied to the second process region P2 may be prevented from passing through a center region C (see FIG. 1) to mix with each other. In other words, the space 50 (or the center region C) may have a function similar to that of the separation space H (or separation region D).

Further, as illustrated in FIG. 2, the transfer port 15 for transferring the wafer W corresponding to a substrate between an external transfer arm 10 and the rotary table 2 is arranged at a side wall of the vacuum chamber 1. The transfer port 15 may be opened/closed by a gate valve (not shown). Note that the wafer W may be transferred back and forth between the concave portion 24 corresponding to the wafer mounting region of the rotary table 2 and the transfer arm 10 when the concave portion 24 is positioned to face the transfer port 15. Accordingly, lift pins that penetrate through the concave portion 24 to lift the wafer W from its rear face and a lift mechanism for the lift pins (not shown) are arranged at a portion below the rotary table 2 corresponding to a transfer position for transferring the wafer W.

Figure 5:
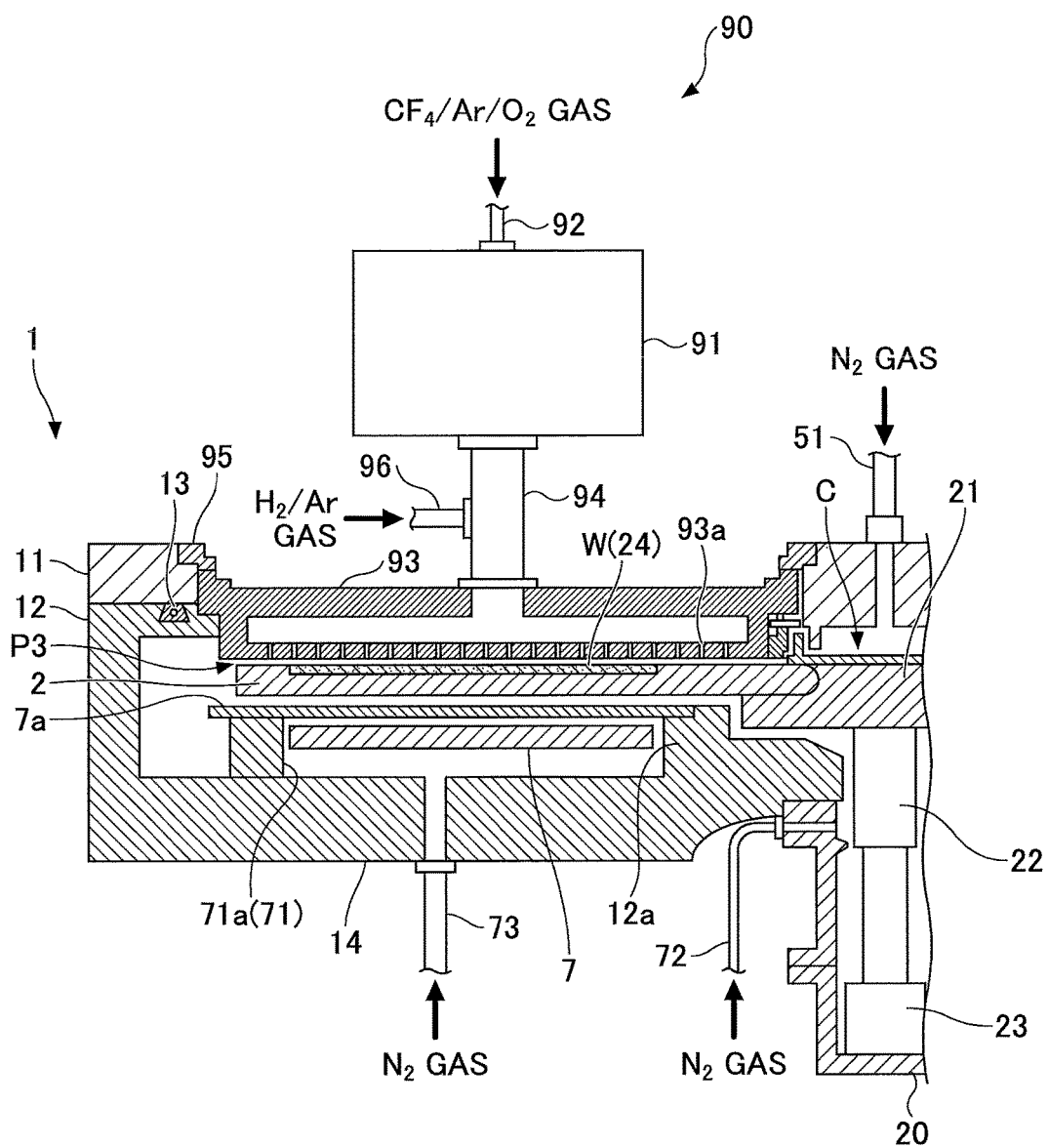
FIG. 5 is a partial cross-sectional view illustrating a third process region of the substrate processing apparatus.
Figure 6:
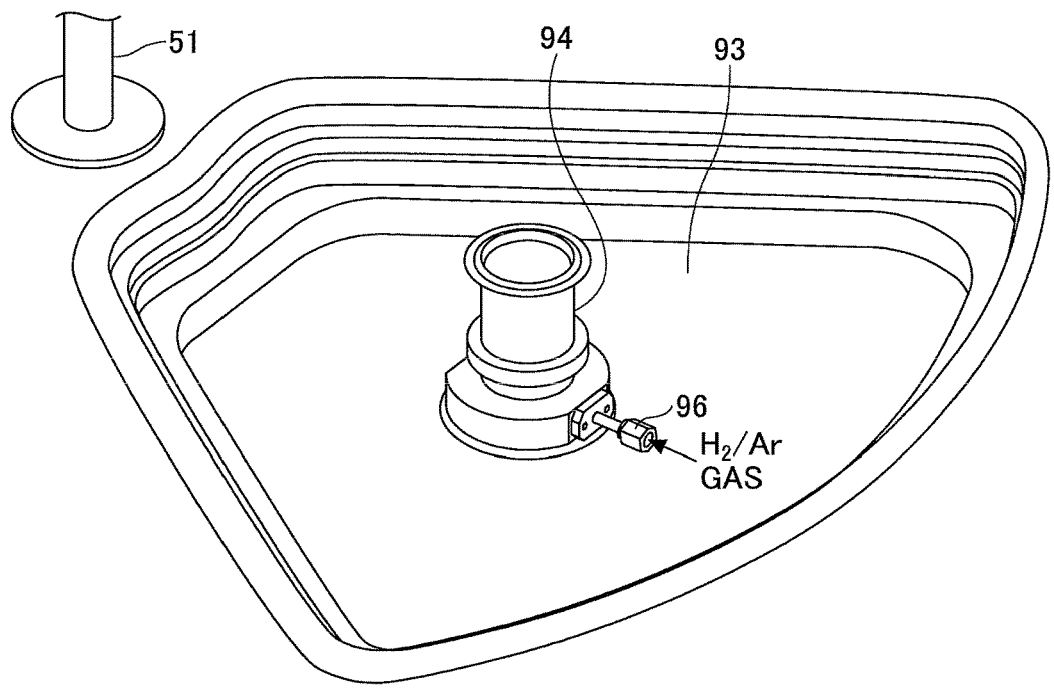
FIG. 6 is a schematic perspective view illustrating a hydrogen-containing gas supply unit of the substrate processing apparatus.
Figure 7:
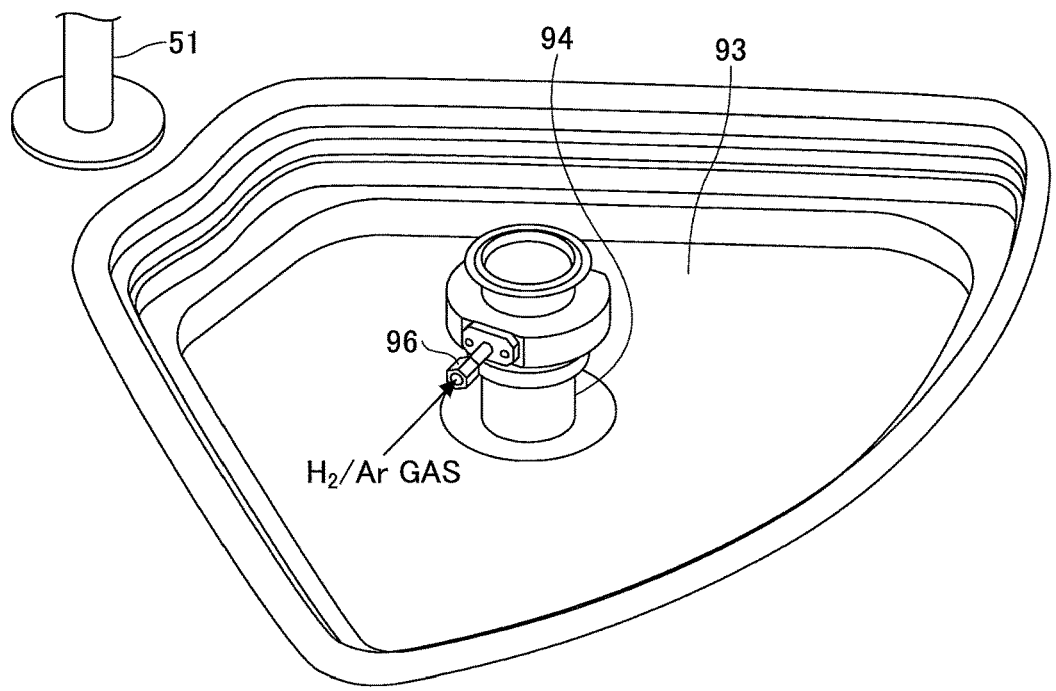
FIG. 7 is another schematic perspective view illustrating the hydrogen-containing gas supply unit of the substrate processing apparatus.

In the following, the activated gas supply unit 90 is described with reference to FIGS. 2 and 5-7. FIG. 5 is a partial cross-sectional view illustrating a third process region P3 of the substrate processing apparatus according to the present embodiment. FIGS. 6 and 7 are schematic perspective views illustrating a hydrogen-containing gas supply unit 96 of the substrate processing apparatus according to the present embodiment.

The activated gas supply unit 90 supplies an activated fluorine-containing gas to a film formed on the wafer W to etch the film. As illustrated in FIGS. 2 and 5, the activated gas supply unit 90 includes a plasma generation unit 91, an etching gas supply pipe 92, a shower head unit 93, a pipe 94, and a hydrogen-containing gas supply unit 96. Note that the shower head unit 93 is an example of a discharge unit.

The plasma generation unit 91 activates a fluorine-containing gas supplied from the etching gas supply pipe 92 using a plasma source. The plasma source is not particularly limited as long as it is capable of activating the fluorine-containing gas to generate F (fluorine) radicals. For example, an inductively coupled plasma (ICP), a capacitively coupled plasma (CCP), or a surface wave plasma (SWP) may be used as the plasma source.

The etching gas supply pipe 92 has one end that is connected to the plasma generation unit 91 and is configured to supply the fluorine-containing gas to the plasma generation unit 91. The other end of the etching gas supply pipe 92 may be connected to an etching gas supply source that stores the fluorine-containing gas via an on-off valve and a flow regulator, for example. Note that a gas that is capable of etching the film formed on the wafer W may be used as the fluorine-containing gas. Specifically, for example, fluorine-containing gases including hydrofluorocarbons such as $CHF_3$ (trifluoromethane), fluorocarbons such as $CF_4$ (carbon tetrafluoride) for etching a silicon oxide film may be used. Further, gases such as Ar gas and/or $O_2$ gas may be added to these fluorine-containing gases at appropriate amounts, for example.

The shower head unit 93 is connected to the plasma generation unit 91 via the pipe 94. The shower head unit 93 supplies the fluorine-containing gas that has been activated by the plasma generation unit 91 into the vacuum chamber 1. The shower head unit 93 is fan-shaped in planar view and is pressed downward along the circumferential direction by a press member 95 that is formed along the outer edge of the fan shape. The press member 95 is fixed to the ceiling plate 11 by a bolt or the like (not shown), and in this way, the internal atmosphere of the vacuum chamber 1 may be maintained airtight. The distance between a bottom face of the shower head unit 93 when it is secured to the ceiling plate 11 and a surface of the rotary table 2 may be arranged to be about 0.5 mm to 5 mm, for example. A lower region of the shower head unit 93 corresponds to the third process region P3 for etching a silicon oxide film, for example. In this way, F radicals contained in the activated fluorine-containing gas that is supplied into the vacuum chamber 1 via the shower head unit 93 may efficiently react with the film formed on the wafer W.

A plurality of gas discharge holes 93a are arranged at the shower head unit 93. In view of the difference in angular velocity of the rotary table 2, a smaller number of the gas discharge holes 93a are arranged at a rotational center side of the shower head unit 93, and a larger number of the gas discharge holes 93a are arranged at an outer periphery side of the shower head unit 93. The total number of the gas discharge holes 93a may be several tens to several hundreds, for example. Also, the diameter of the plurality of gas discharge holes 93a may be about 0.5 mm to 3 mm, for example. The activated fluorine-containing gas supplied to the shower head unit 93 may be supplied to the space between the rotary table 2 and the shower head unit 93 via the gas discharge holes 93a.

The pipe 94 is arranged upstream of the shower head unit 93 and connects the plasma generation unit 91 and the shower head unit 93. The hydrogen-containing gas supply unit 96 is arranged at an outer periphery side of the pipe 94 with respect to the radial direction of the rotary table 2.

The hydrogen-containing gas supply unit 96 has one end that is connected to the pipe 94 and is configured to supply a hydrogen-containing gas into the pipe 94. The other end of the hydrogen-containing gas supply unit 96 may be connected to a hydrogen-containing gas supply source via a switching valve and a flow regulator, for example.

The hydrogen-containing gas supply unit 96 is preferably arranged closer to the shower head unit 93 than the plasma generation unit 91. In this way, the hydrogen-containing gas supplied into the pipe 94 may be prevented from flowing backward into the plasma generation unit 91. In turn, $H_2$ plasma may be prevented from being generated in the plasma generation unit 91. As a result, contamination by a metal constituting the plasma generation unit 91 may be prevented, and the life of the devices and components constituting the plasma generation unit 91 may be prolonged, for example. Also, a flow rate difference may be easily created between the flow rate of the hydrogen-containing gas supplied to the rotational center side of the rotary table 2 and the flow rate of the hydrogen-containing gas supplied to the outer periphery side of the rotary table 2, for example.

Note that a gas mixture of $H_2$ (hydrogen) gas and Ar gas (hereinafter referred to as "$H_2$/Ar gas") may be used as the hydrogen-containing gas, for example. Also, the supply flow rate of $H_2$ gas may be controlled to be greater than or equal to 1 sccm and less than or equal to 50 sccm, for example, and the supply flow rate of the Ar gas may be controlled to be greater than or equal to 500 sccm and less than or equal to 10 slm, for example.

Note that in the example of FIGS. 5 and 6, one hydrogen-containing gas supply unit 96 is arranged at an outer periphery side of the pipe 94 with respect to a radial direction of the rotary table 2. However, the present invention is not limited to such an arrangement. In another example, as illustrated in FIG. 7, the hydrogen-containing gas supply unit 96 may be arranged ahead of the pipe 94 or behind the pipe 94 with respect to the rotational direction of the rotary table 2. Also, in some examples, a plurality of the hydrogen-containing gas supply units 96 may arranged at the pipe 94.

Further, the substrate processing apparatus includes a control unit 100 configured by a computer for performing control operations of the substrate processing apparatus. The control unit 100 includes a memory storing a program for causing the substrate processing apparatus to implement a substrate processing method according to an embodiment of the present invention under control of the control unit 100 as described below. The program includes a set of steps for implementing operations of the substrate processing apparatus as described below and may be installed in the control unit 100 from a storage unit 100 that may be configured by a hard disk, a compact disk, a magnetic optical disk, a memory card, a flexible disk, or some other type of computer-readable storage medium.

Substrate Processing Method

In the following, an exemplary substrate processing method using the substrate processing apparatus according to the above-described embodiment is described. Note that an example of a method of forming a $SiO_2$ film in a via hole corresponding to a concave pattern that is formed in the wafer W is described below. Also, note that in the example described below, it is assumed that a Si-containing gas is used as the first reaction gas, an oxidizing gas is used as the second reaction gas, and a gas mixture of $CF_4$, Ar gas, and $O_2$ gas (hereinafter referred to as "$CF_4$/Ar/$O_2$ gas") is used as the fluorine-containing gas.

First, a gate valve (not shown) is opened, and a wafer W is transferred from the exterior by the transfer arm 10 via the transfer port 15 to be placed within one of the concave portions 24 of the rotary table 2 as illustrated in FIG. 2. The transfer of the wafer W may be accomplished by lifting the lift pins (not shown) from the bottom side of the vacuum chamber 1 via the through holes that are formed at the bottom face of the concave portion 24 when the concave portion 24 comes to a halt at a position facing the transfer port 15. Such a transfer of the wafer W may be performed with respect to each of the five concave portions 24 of the rotary table 2 by intermittently rotating the rotary table 2 to place a wafer W in each of the concave portions 24, for example.

Then, the gate valve is closed, and air is drawn out of the interior of the vacuum chamber 1 by the vacuum pump 64. Then, $N_2$ gas as a separation gas is discharged at a predetermined flow rate from the separation gas nozzles 41 and 42, and $N_2$ gas is discharged at a predetermined flow rate from the separation gas supply pipe 51 and the purge gas supply pipes 72 and 73. In turn, the pressure regulating unit 65 adjusts the pressure within the vacuum chamber 1 to a preset processing pressure. Then, the heater unit 7 heats the wafers W up to 450° C., for example, while the rotary table 2 is rotated clockwise at a rotational speed of 60 rpm, for example.

Then, a film forming process is performed. In the film forming process, a Si-containing gas is supplied from the reaction gas nozzle 31, and an oxidizing gas is supplied from the reaction gas nozzle 32. Note that in this process, no gas is supplied from the activated gas supply unit 90.

When one of the wafers W passes the first process region P1, the Si-containing gas as a source gas that is supplied from the reaction gas nozzle 31 is adsorbed to the surface of the wafer W. Then, as the rotary table 2 is rotated, the wafer W having the Si-containing gas adsorbed to its surface passes the separation region D including the separation gas nozzle 42 where the wafer W is purged. Thereafter, the wafer W enters the second process region P2. In the second process region P2, the oxidizing gas is supplied from the reaction gas nozzle 32, and Si components contained in the Si-containing gas is oxidized by the oxidizing gas. As a result, $SiO_2$ corresponding to a reaction product of the oxidization is deposited on the surface of the wafer W.

The wafer W that has passed the second process region P2 passes the separation region D including the separation gas nozzle 41 where the wafer W is purged. Then, the wafer W enters the first process region P1 once again. Then, the Si-containing gas that is supplied from the reaction gas nozzle 31 is adsorbed to the surface of the wafer W.

As described above, in the film forming process, the rotary table 2 is consecutively rotated a plurality of times while supplying the first reaction gas and the second reaction gas into the vacuum chamber 1 but without supplying a fluorine-containing gas into the vacuum chamber 1. In this way, $SiO_2$ corresponding to the reaction product may be deposited on the surface of the wafer W and a $SiO_2$ film (silicon oxide film) may be formed on the wafer W surface.

Also, if necessary or desired, after the $SiO_2$ film has been formed to a predetermined thickness, the supply of the Si-containing gas from the reaction gas nozzle 31 may be stopped but the oxidizing gas may continuously be supplied from the reaction gas nozzle 32 while rotation of the rotary table 2 is continued. In this way, a modification process may be performed on the $SiO_2$ film.

By executing the film forming process as described above, the $SiO_2$ film may be formed in a via hole corresponding to one example of a concave pattern. The $SiO_2$ film that is first formed in the via hole may have a cross-sectional shape substantially corresponding to the concave shape of the via hole.

Then, an etching process is performed. In the etching process, the $SiO_2$ film is etched to have a V-shaped cross-sectional shape. In the following, specific process steps of the etching process are described.

As shown in FIG. 2, the supply of the Si-containing gas and the oxidizing gas from the reaction gas nozzles 31 and 32 are stopped, and $N_2$ gas as a purge gas is supplied. The temperature of the rotary table 2 is set to a temperature of about 600° C., for example, that is suitable for etching. The rotation speed of the rotary table 2 may be set to 60 rpm, for example. In such a state, the $CF_4/Ar/O_2$ gas is supplied from the shower head unit 93 of the activated gas supply unit 90, the $H_2/Ar$ gas is supplied from the hydrogen-containing gas supply unit 96 at a preset flow rate, for example, and the etching process is started.

Note that at this time, the rotary table 2 is rotated at a relatively low speed such that the $SiO_2$ film may be etched to have a V-shaped cross-sectional shape. By etching the SiO2 film in the via hole into a V-shape, a hole having a wide opening at its top portion may be formed in the $SiO_2$ film, and in this way, when embedding a $SiO_2$ film in the hole in a subsequent film forming process, the $SiO_2$ may reach the bottom of the hole such that bottom-up characteristics may be improved and void generation may be prevented in the film forming process.

Note that when etching the SiO2 film in the etching process, the etching amount may vary depending on the etching location, namely, from the rotational center side to the outer periphery side of the wafer W surface. When such a variation in the etching amount is created in the wafer W surface, it is difficult to secure etching uniformity in the wafer W surface.

In view of the above, the substrate processing apparatus according to the present embodiment has the activated gas supply unit 90 arranged at the upstream side of the shower head unit 93, and includes the pipe 94 that is capable of supplying a fluorine-containing gas to the shower head unit 93, and at least one hydrogen-containing gas supply unit 96 that is arranged at the pipe 94 and is capable of supplying a hydrogen-containing gas into the pipe 94.

The hydrogen-containing gas supplied to the pipe 94 from the hydrogen-containing gas supply unit 96 reacts with F radicals contained in the fluorine-containing gas supplied from the plasma generation unit 91 to the pipe 94 and the shower head unit 93, and as a result, HF (hydrogen fluoride) is generated. In this way, the amount of F radicals contained in the fluorine-containing gas supplied to the pipe 94 and the shower head 93 is reduced, and an etching reaction principally based on F radicals may be adjusted to an etching reaction principally based on CF radicals.

Note that CF radicals as compared to F radicals have a characteristic of selectively etching a $SiO_2$ film over a SiN film or a Si film. Accordingly, in the substrate processing apparatus according to the present embodiment that includes the hydrogen-containing gas supply unit 96, only a $SiO_2$ film may be selectively etched.

Also, by adjusting the position of the hydrogen-containing gas supply unit 96 arranged at the pipe 94 and/or the flow rate of the hydrogen-containing gas supplied from the hydrogen-containing gas supply unit 96, the in-plane distribution of the concentration of F radicals supplied from the shower head unit 93 to the space between the shower head unit 93 and the rotary table 2 may be controlled. As a result, the etching amount distribution in the wafer W surface may be controlled.

Note that the flow rate of the hydrogen-containing gas supplied from the hydrogen-containing gas supply unit 96 may be controlled by the control unit 100 to flow at a preset flow rate, or the flow rate may be controlled by an operator of the substrate processing apparatus, for example.

As described above, in the etching process, the rotary table 2 is rotated consecutively a plurality of times while supplying the fluorine-containing gas and the hydrogen-containing gas into the vacuum chamber 1 but without supplying the first reaction gas and the second reaction gas into the vacuum chamber 1. In this way, the $SiO_2$ film may be etched.

Then, the above-mentioned film forming process is performed again. In this film forming process, another $SiO_2$ film is formed on the $SiO_2$ film that has been etched into a V-shape in the above etching process to increase the film thickness. Because a film is formed on the $SiO_2$ film that has been etched into a V-shape, the opening of the hole in the $SiO_2$ film may be prevented from closing during film formation such that the film may be formed from the bottom portion of the $SiO_2$ film.

Then, the above-mentioned etching process is performed again. In the etching process, the $SiO_2$ film is etched into a V-shape.

The above-described film forming process and etching process may be alternately performed as many times as necessary to embed the via hole while preventing the generation of a void in the $SiO_2$ film. The number of times these processes are repeated may be adjusted to a suitable number according to the shape of the concave pattern (e.g. via hole) such as the aspect ratio of the concave pattern. For example, the number of repetitions may be increased as the aspect ratio is increased. Also, the number of repetitions is expected to be greater when embedding a via hole as compared to embedding a trench, for example.

Note that in the present embodiment, the film forming process and the etching process are repeatedly performed to embed a film in a concave pattern that is formed in the surface of the wafer W. However, the present invention is not limited thereto.

For example, a wafer W already having a film formed on its surface may be transferred and loaded in the substrate processing apparatus, and only the etching process may be performed on the wafer W.

Also, in some examples, the first reaction gas, the second reaction gas, the fluorine-containing gas, and the hydrogen-containing gas may be simultaneously supplied into the vacuum chamber 1 while consecutively rotating the rotary table 2 a plurality of times, and the film forming process and the etching process may each be performed once during one rotation cycle of the rotary table 2. Further, in some examples, a cycle of performing each of the film forming process and the etching process once may be repeated a plurality of times.

Examples

In the following, results of simulations and experiments conducted using the substrate processing apparatus according to the above-described embodiment are described.

Figure 8A:
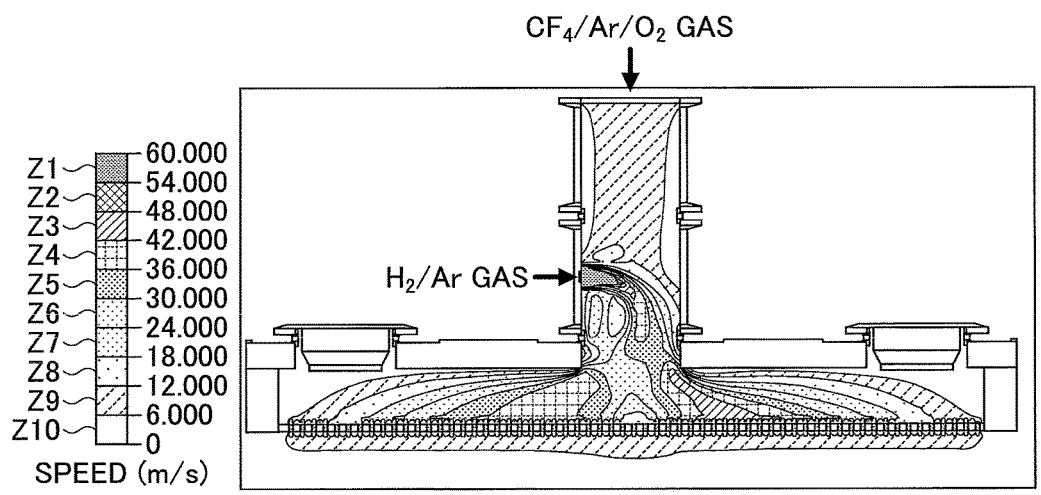
FIGS. 8A and 8B are diagrams showing simulation results of an internal air flow rate within an activated gas supply unit during an etching process.
Figure 8B:
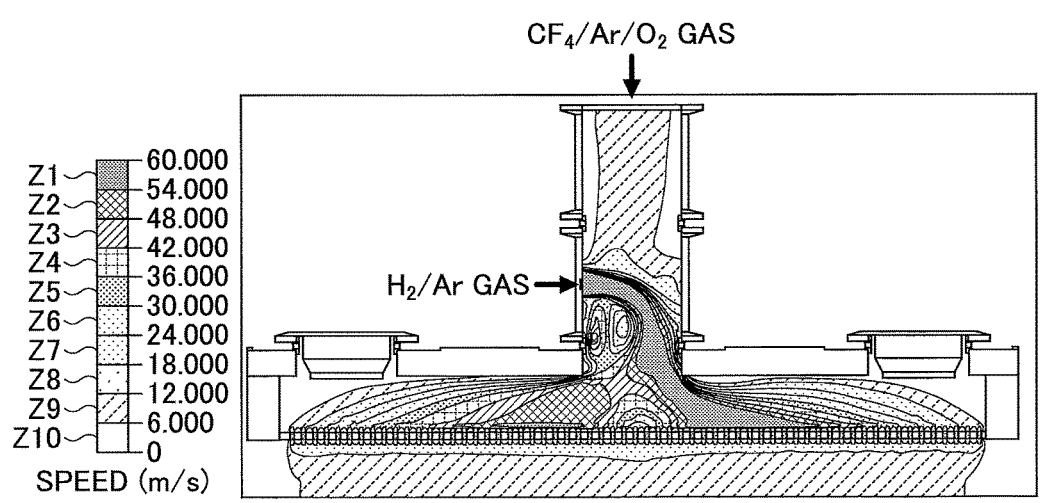

FIGS. 8A-8B are diagrams showing simulation results of the internal air flow rate within the activated gas supply unit 90 during the etching process. Specifically, FIGS. 8A-8B show simulation results of the internal air flow rate within the shower head unit 93 and the pipe 94 when the $CF_4/Ar/O_2$ gas is supplied from the etching gas supply pipe 92 to the shower head unit 93 via the plasma generation unit 91 and the pipe 94, and the $H_2/Ar$ gas is supplied to the interior of the pipe 94 from the hydrogen-containing gas supply unit 96 that is arranged at the outer periphery side (left side in FIG. 5) of the pipe 94 with respect to the radial direction of the rotary table 2.

Note that the following simulation conditions were used in the present experiment. That is, the pressure of the vacuum chamber 1 was set to 2 Torr, and the temperature of the rotary table 2 was set to 80° C. Also, at the etching gas supply pipe 92, the $CF_4$ gas flow rate was set to 10 sccm, the Ar gas flow rate was set to 2 slm, and the $O_2$ gas flow rate was set to 30 sccm. At the hydrogen-containing gas supply unit 96, the $H_2$ gas flow rate was set to 20 sccm.

Under the above conditions, the flow rate of the Ar gas supplied from the hydrogen-containing gas supply unit 96 was varyingly set to 2 slm and 4 slm, and the internal air flow rate within the shower head unit 93 and the pipe 94 were simulated.

FIG. 8A is a diagram showing the simulation result in the case where the flow rate of the Ar gas supplied from the hydrogen-containing gas supply unit 96 was set to 2 slm. FIG. 8B is a diagram showing the simulation result in the case where the flow rate supplied from the hydrogen-containing gas supply unit 96 was set to 4 slm.

In FIGS. 8A and 8B, region Z1 represents a region with the highest air flow rate. Further, the air flow rate being represented decreases from region Z2 to region Z3, from region Z3 to region Z4, from region Z4 to region Z5, from region Z5 to region Z6, from region Z6 to region Z7, from region Z7 to region Z8, from region Z8 to region Z9, and from region Z9 to region Z10.

Referring to FIGS. 8A and 8B, when the flow rate of the Ar gas supplied from the hydrogen-containing gas supply unit 96 is increased, the air flow rate within the shower head unit 93 toward the rotational center of the rotary table 2 (right side in FIGS. 8A and 8B) becomes greater than the air flow rate toward the outer periphery of the rotary table 2 (left side in FIGS. 8A and 8B). In other words, by increasing the Ar gas flow rate of the hydrogen-containing gas supply unit 96, the $H_2$ volume ratio may be increased in a region located on the opposite side of the hydrogen-containing gas supply unit 96, and in this way, the amount of F radicals in this region may be reduced. As a result, the amount of etching of the SiO2 film within this region may be reduced.

Figure 9A:
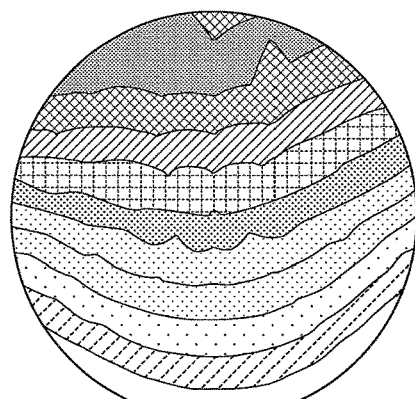
FIGS. 9A-9C are diagrams showing measurements of an etching amount within a wafer surface.
Figure 9A:
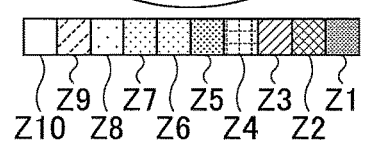
Figure 9B:
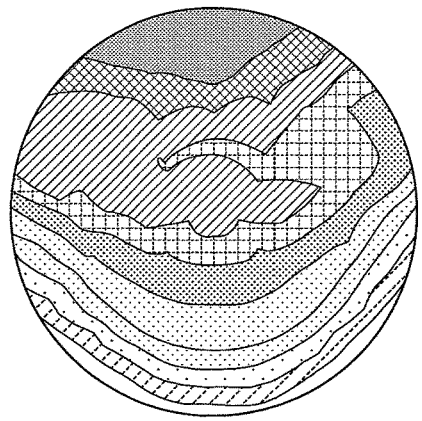
Figure 9B:
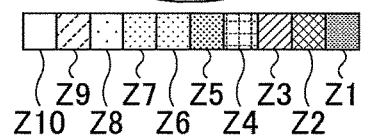
Figure 9C:
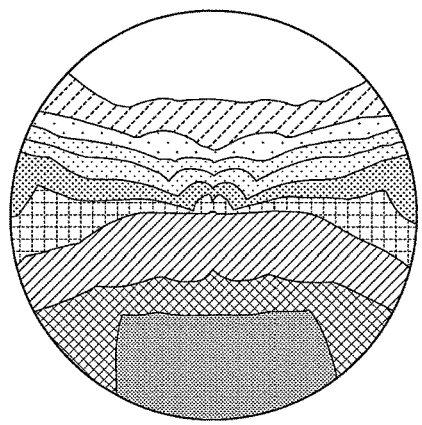
Figure 9C:
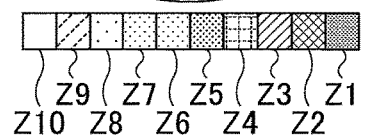

FIGS. 9A-9C are diagrams indicating measurements of the etching amount within the wafer W surface. Specifically, FIGS. 9A-9C indicate measurements of the etching amount (nm) within the surface of a wafer W that has been placed on the rotary table 2 in the case where the $CF_4/Ar/O_2$ gas was supplied from the etching gas supply pipe 92 to the shower head unit 93 via the plasma generation unit 91 and the pipe 94, and the $H_2/Ar$ gas was supplied to the interior of the pipe 94 from the hydrogen-containing gas supply unit 96 arranged at the outer periphery side of the pipe 94 with respect to the radial direction of the rotary table 2.

Note that the following etching conditions were used in the above experiment. That is, the pressure of the vacuum chamber 1 was set to 1.8 Torr, the temperature of the rotary table 2 was set to 400° C., and the rotational speed of the rotary table 2 was set to 60 rpm. Also, at the etching gas supply pipe 92, the $CF_4$ gas flow rate was set to 10 sccm, the Ar gas flow rate was set to 2 slm, the $O_2$ gas flow rate was set to 30 sccm. At the hydrogen-containing gas supply unit 96, the Ar gas flow rate was set to 4 slm.

Under the above conditions, the flow rate of the $H_2$ gas supplied from the hydrogen-containing gas supply unit 96 was varyingly set to 0 sccm, 5 sccm, and 20 sccm, and the etching amount within the wafer W surface was measured. Also, the etching time was arranged to be 60 seconds when the $H_2$ gas flow rate was set to 0 sccm, the etching time was arranged to be 120 seconds when the $H_2$ gas flow rate was set to 5 sccm, and the etching time was arranged to be 120 seconds when the $H_2$ gas flow rate was set to 20 sccm. Note that although measurements of a case where the etching time was arranged to be 120 seconds when the $H_2$ gas flow rate was set to 0 sscm are not shown, because there is generally a proportional relationship between the etching amount and the etching time, it can be estimated that the distribution of the etching amount in the wafer W surface in this case would be substantially the same as the measurements obtained in the case where the etching time was arrange to be 60 seconds.

FIG. 9A is a diagram showing the measurements of the etching amount in the wafer W surface when the flow rate of the $H_2$ gas supplied from the hydrogen-containing gas supply unit 96 was set to 0 sccm. FIG. 9B is a diagram showing the measurements of the etching amount in the wafer W surface when the flow rate of the $H_2$ gas supplied from the hydrogen-containing gas supply unit 96 was set to 5 sccm. FIG. 9C is a diagram showing the measurements of the etching amount in the wafer W surface when the flow rate of the $H_2$ gas supplied from the hydrogen-containing gas supply unit 96 was set to 20 sccm. Note that in FIGS. 9A-9C, the upper side represents the rotational center side of the rotary table 2, and the lower side represents the outer periphery side of the rotary table 2.

In FIGS. 9A-9C, region Z1 represents a region where the etching amount was the greatest. Further, the etching amount being represented decreases from region Z2 to region Z3, from region Z3 to region Z4, from region Z4 to region Z5, from region Z5 to region Z6, from region Z6 to region Z7, from region Z7 to region Z8, from region Z8 to region Z9, and from region Z9 to region Z10.

As can be appreciated from FIG. 9A, when the H$_2$ gas is not supplied from the hydrogen-containing gas supply unit 96, the etching amount of the wafer W surface is greater toward the rotational center side of the rotary table 2 and is smaller at the outer periphery side.

On the other hand, as illustrated in FIG. 9B, when the H$_2$ gas is supplied from the hydrogen-containing gas supply unit 96 at a flow rate of 5 sccm, a difference in the etching amounts of the wafer W surface at the rotational center side and a middle portion of the rotary table 2 can be reduced as compared with the case where the H$_2$ gas is not supplied.

Also, as illustrated in FIG. 9C, when the H$_2$ gas is supplied from the hydrogen-containing gas supply unit 96 at a flow rate of 20 sccm, the etching amount of the wafer W surface is smaller at the rotational center side of the rotary table 2 and is greater at the outer periphery side. That is, the variation trend in the etching amount distribution is the reverse of the etching amount distribution illustrated in FIG. 9A.

As can be appreciated from the above, the etching amount within the wafer W surface may be controlled by adjusting the flow rate of the H$_2$ gas supplied from the hydrogen-containing gas supply unit 96.

As described above, according to an aspect of the substrate processing apparatus and the substrate processing method of the present embodiment, the etching amount distribution in a substrate surface may be controlled.

Although a substrate processing apparatus and a substrate processing method according to the present invention have been described above with respect to certain illustrative embodiments, the present invention is not limited to the above embodiments, and various variations and modifications may be made within the scope of the present invention.

For example, in the above descriptions, an embodiment in which the plasma generation unit 91 of the activated gas supply unit 90 is arranged above the shower head unit 93 via the pipe 94 is illustrated. However, the position of the plasma generation unit 91 is not particularly limited as long as it is arranged at a suitable position such that a fluorine-containing gas may be activated and supplied to a film that is formed on a wafer W. For example, the plasma generation unit 91 may be arranged inside the shower head unit 93 or below the shower head 93.

The present application is based on and claims the benefit of priority to Japanese Patent Application No. 2015-041499 filed on Mar. 3, 2015, the entire contents of which are hereby incorporated by reference.

What is claimed is:

1. A substrate processing method comprising:
an etching step of mounting a substrate on a surface of a rotary table arranged in a vacuum chamber and supplying a fluorine-containing gas from a fluorine-containing gas supplying unit into the vacuum chamber, while consecutively rotating the rotary table a plurality of times, to etch a film formed on a surface of the substrate;
wherein the etching step includes supplying the fluorine-containing gas to the surface of the rotary table from a discharge unit that is connected to the fluorine-containing gas supplying unit via a pipe and activating the fluorine-containing gas by a plasma generation unit, said discharge unit including a gas discharge hole for discharging the activated fluorine-containing gas, and the etching step further including supplying a hydrogen-containing gas, after activating the fluorine-containing gas, from a hydrogen-containing gas supply unit arranged between the discharge unit and the plasma generation unit and a downstream side of the fluorine-containing gas supplying unit and the plasma generation unit, said hydrogen-containing gas supply unit being arranged at a position closer to the discharge unit than the plasma generation unit,
wherein the etching step further includes:
supplying an argon gas from the fluorine-containing gas supplying unit and the hydrogen-containing gas supply unit, and
adjusting a discharge amount of the argon gas supplied from the hydrogen-containing gas supply unit.

2. The substrate processing method according to claim 1, wherein
a flow rate of the hydrogen containing gas is varied based on a distribution of the fluorine-containing gas that is supplied to the surface of the rotary table.

3. The substrate processing method according to claim 1, further comprising:
a film forming step of supplying a first reaction gas and a second reaction gas, which reacts with the first reaction gas, into the vacuum chamber while rotating the rotary table to form the film on the surface of the substrate.

4. The substrate processing method according to claim 3, wherein
the film forming step includes a step of supplying the first reaction gas and the second reaction gas into the vacuum chamber without supplying the fluorine-containing gas into the vacuum chamber while consecutively rotating the rotary table a plurality of times; and
the etching step includes a step of supplying the fluorine-containing gas and the hydrogen-containing gas into the vacuum chamber without supplying the first reaction gas and the second reaction gas into the vacuum chamber while consecutively rotating the rotary table a plurality of times.

5. The substrate processing method according to claim 3, wherein the first reaction gas, the second reaction gas, the activated fluorine-containing gas, and the hydrogen-containing gas are simultaneously supplied into the vacuum chamber while consecutively rotating the rotary table a plurality of times; and
the film forming step and the etching step are each performed once during one rotation cycle of the rotary table, and the rotation cycle is repeated a plurality of times.

6. The substrate processing method according to claim 1, wherein the fluorine-containing gas is activated by the plasma generation unit before the fluorine-containing gas is mixed with the hydrogen-containing gas.

7. The substrate processing method according to claim 1, wherein the method further comprises a step of controlling in-plane distribution of concentration of fluorine radicals supplied from a discharge hole a shower head of the discharge unit that is arranged so as to directly face a turntable within a space between the shower head and the turntable by adjusting a position of the hydrogen-containing gas supply unit and a flow rate of the hydrogen-containing gas supplied from the hydrogen-containing gas supply unit.

8. The substrate processing method according to claim 1, wherein the etching step further includes decreasing an etching amount of the film in an area opposite from the hydrogen-containing gas supply unit by increasing the amount of the argon gas supplied from the hydrogen-containing gas supply unit.

\* \* \* \* \*